United States Patent
Omote et al.

(10) Patent No.: US 8,072,118 B2
(45) Date of Patent: Dec. 6, 2011

(54) SURFACE ACOUSTIC WAVE DEVICE

(75) Inventors: Ryoichi Omote, Ishikawa-gun (JP); Norihiko Takada, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/878,175

(22) Filed: Sep. 9, 2010

(65) Prior Publication Data

US 2010/0327694 A1 Dec. 30, 2010

Related U.S. Application Data

(63) Continuation of application No. PCT/JP2009/000254, filed on Jan. 23, 2009.

(30) Foreign Application Priority Data

Mar. 19, 2008 (JP) .................................. 2008-071612

(51) Int. Cl.
*H03H 9/25* (2006.01)
*H01L 41/053* (2006.01)

(52) U.S. Cl. ...................... 310/313 R; 310/344; 310/346

(58) Field of Classification Search .............. 310/313 R, 310/340, 344, 346, 348
See application file for complete search history.

(56) References Cited

U.S. PATENT DOCUMENTS

| | | | | |
|---|---|---|---|---|
| 7,064,471 B2 * | 6/2006 | Ikeda et al. | ................ | 310/313 D |
| 7,295,089 B2 * | 11/2007 | Shibahara et al. | ............ | 333/193 |
| 7,479,852 B2 * | 1/2009 | Takamine | ..................... | 333/193 |
| 2006/0186755 A1 * | 8/2006 | Mori et al. | ................ | 310/313 R |
| 2009/0051245 A1 * | 2/2009 | Takayama et al. | ........ | 310/313 R |
| 2009/0096321 A1 * | 4/2009 | Aikawa et al. | ............ | 310/313 R |

FOREIGN PATENT DOCUMENTS

| | | |
|---|---|---|
| JP | 07-030362 A | 1/1995 |
| JP | 2003-174107 A | 6/2003 |
| JP | 2006-217226 A | 8/2006 |
| JP | 2007-259430 A | 10/2007 |
| JP | 2007-266865 A | 10/2007 |

OTHER PUBLICATIONS

Official Communication issued in International Patent Application No. PCT/JP2009/000254, mailed on Apr. 21, 2009.

* cited by examiner

*Primary Examiner* — Thomas M Dougherty
(74) *Attorney, Agent, or Firm* — Keating & Bennett, LLP

(57) ABSTRACT

A highly reliable surface acoustic wave device includes wiring lines that do not easily rupture at a three-dimensional wiring portion. The surface acoustic wave device includes a plurality of surface acoustic wave elements located on a piezoelectric substrate, a supporting member arranged on the piezoelectric substrate so as to enclose vibrating portions including electrodes such as IDT electrodes, and a cover member stacked so as to cover openings of the supporting member and to define hollow spaces facing vibrating electrodes. Furthermore, a three-dimensional wiring portion at which a first wiring line and a second wiring line are stacked with an insulating layer interposed therebetween is provided on the piezoelectric substrate. The three-dimensional wiring portion is enclosed by the supporting member, and thereby disposed inside a space enclosed by the piezoelectric substrate, the supporting member, and the cover member.

6 Claims, 6 Drawing Sheets

SURFACE ACOUSTIC WAVE DEVICE

BACKGROUND OF THE INVENTION

1. Field of the Invention

The present invention relates to surface acoustic wave devices including a plurality of surface acoustic wave elements electrically connected to each other by wiring lines, and more specifically, relates to surface acoustic wave devices including three-dimensional wiring portions at which a plurality of wiring lines intersect with each other in a three-dimensional manner.

2. Description of the Related Art

To date, surface acoustic wave devices have been widely used for band-pass filters for, for example, cellular phones. In order to reduce the size of such surface acoustic wave devices, the following Japanese Unexamined Patent Application Publication No. 2006-217226 discloses a surface acoustic wave device shown in FIG. 7.

Figure 7:
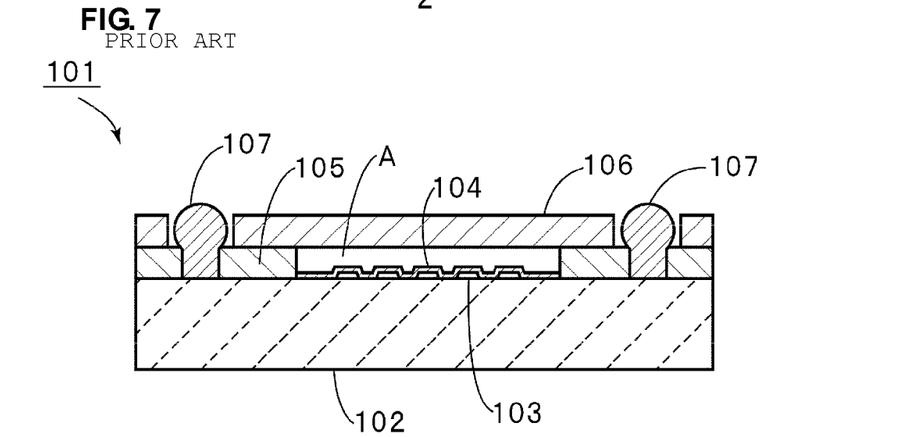
FIG. 7 is a schematic cross-section of a known surface acoustic wave device viewed from the front.

A surface acoustic wave device 101 includes a piezoelectric substrate 102 composed of, for example, LiTaO$_3$. An IDT electrode 103 is formed on the piezoelectric substrate 102. A protective film 104 is formed so as to cover the IDT electrode 103.

Surface acoustic waves are excited by applying an AC voltage to the IDT electrode 103. A space A is formed so as not to prevent the vibration of the surface acoustic waves. That is, the space A is formed over a vibrating portion including the IDT electrode 103 so as not to prevent the vibrating portion from vibrating.

A surrounding wall 105 is formed so as to enclose the vibrating portion and thereby to form the space A. The surrounding wall 105 is formed by patterning a heat-resistant photosensitive resin. In addition, a cover 106 is stacked so as to cover the space A enclosed by the surrounding wall 105. The cover 106 is formed of a synthetic resin layer.

Moreover, through-holes extend through the surrounding wall 105 and the cover 106, and bumps 107 are disposed inside the through-holes. The bumps 107 are electrically connected to the IDT electrode 103 at predetermined portions (not shown).

The surface acoustic wave device 101 is designed such that the size, in particular, the thickness thereof is reduced by using the surrounding wall 105 composed of the photosensitive resin and the cover 106 formed of the synthetic resin layer.

Figure 8:
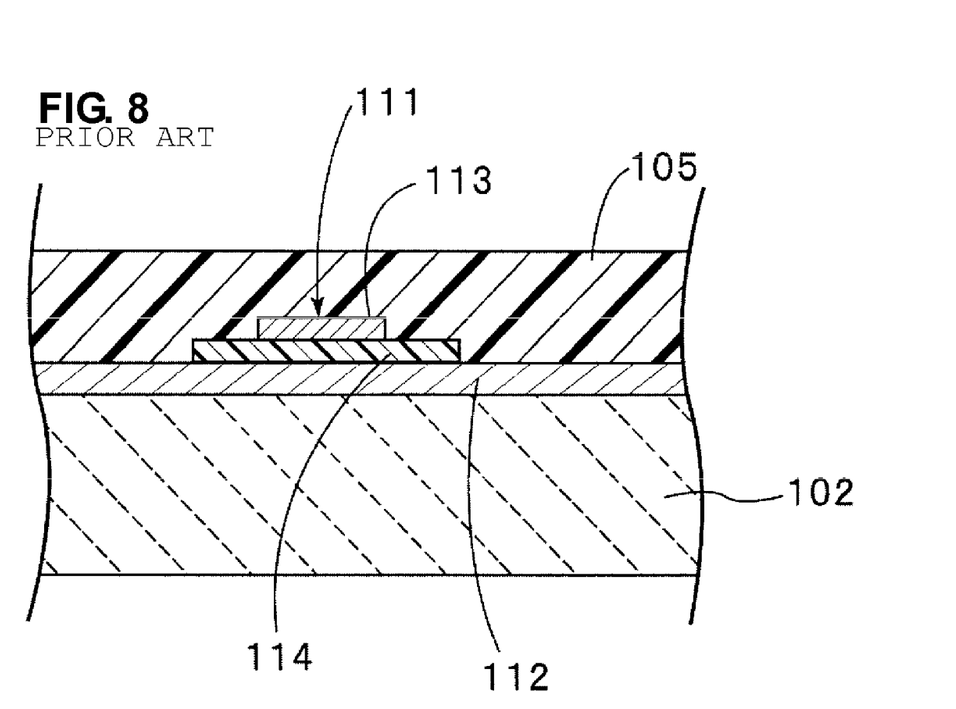
FIG. 8 is a partial cross-section viewed from the front illustrating a part of a three-dimensional wiring portion in the known surface acoustic wave device.

When band-pass filters, for example, for cellular phones, are configured, filter circuits are often formed by electrically connecting a plurality of surface acoustic wave elements. In this case, a common piezoelectric substrate is used for the plurality of surface acoustic wave elements. That is, a plurality of vibrating portions are formed on one piezoelectric substrate so as to form the surface acoustic wave elements. Subsequently, the plurality of vibrating portions are electrically connected to each other by wiring lines formed on the piezoelectric substrate. In this case, the plurality of wiring lines intersect with each other in a three-dimensional manner at some portions so that the size of the device is reduced. As shown in FIG. 8, for example, a first wiring line 112 and a second wiring line 113 intersect with each other in a three-dimensional manner at a three-dimensional wiring portion 111. An insulating layer 114 is formed between the first wiring line 112 and the second wiring line 113.

However, when the piezoelectric substrate is commonly used for a plurality of surface acoustic wave elements having a structure with which the size and the thickness of the devices can be reduced as in the surface acoustic wave device 101 described in Japanese Unexamined Patent Application Publication No. 2006-217226, ruptures disadvantageously occur in wiring lines at the three-dimensional wiring portions. For example, when two or more surface acoustic wave elements 101 and at least one three-dimensional wiring portion 111 shown in FIG. 8 are formed on one piezoelectric substrate, the three-dimensional wiring portion is disposed between the surrounding wall 105 and the piezoelectric substrate 102. Therefore, the second wiring line 113, located at an upper position, is disposed between the insulating layer 114 and the surrounding wall 105.

The insulating layer 114 is formed so as to improve characteristics of the device by reducing the parasitic capacitance between the first wiring line 112 and the second wiring line 113, and to ensure the electrical insulation at the three-dimensional intersecting portion. To this end, the insulating layer 114 is composed of a synthetic resin such as polyimide, which differs from the synthetic resin of the surrounding wall 105.

Therefore, when the ambient temperature changes, ruptures sometimes occur at the second wiring line 113 due to stress caused by a difference in the coefficients of linear expansion between the surrounding wall 105 disposed over the second wiring line 113 and the insulating layer 114 disposed under the second wiring line.

SUMMARY OF THE INVENTION

In order to overcome the disadvantages of the known technology, preferred embodiments of the present invention provide a highly reliable surface acoustic wave device in which ruptures do not easily occur at three-dimensional wiring portions on a piezoelectric substrate.

A preferred embodiment of the present invention provides a surface acoustic wave device including at least two surface acoustic wave elements each including a piezoelectric substrate including a first main surface and a second main surface that face each other, an electrode arranged on the first main surface of the piezoelectric substrate so as to excite surface acoustic waves, an electrode pad located on the first main surface of the piezoelectric substrate and electrically connected to the electrode, a supporting member that is thicker than the electrode and is arranged on the first main surface of the piezoelectric substrate so as to enclose a vibrating portion, and a cover member arranged on the supporting member so as to cover the vibrating portion and to define a hollow space facing the electrode of the vibrating portion; at least two wiring lines arranged to electrically connect the surface acoustic wave elements to each other, the at least two wiring lines including a first wiring line and a second wiring line disposed above the first wiring line while intersecting with the first wiring line in a three-dimensional manner; and an insulating layer composed of a material that differs from a material of the supporting member and disposed between the first and second wiring lines at a portion where the first and second wiring lines intersect with each other in a three-dimensional manner. The supporting member includes an opening that encloses a three-dimensional wiring portion at which the first and second wiring lines intersect with each other with the insulating layer interposed therebetween, and thereby the three-dimensional wiring portion is disposed in a space enclosed by the piezoelectric substrate, the supporting member, and the cover member.

In accordance with a specific preferred embodiment of the surface acoustic wave device according to the present invention, the device further includes an adhesiveness improving film having an adhesiveness to the piezoelectric substrate that is higher than an adhesiveness of the supporting member to the piezoelectric substrate and located on the first main surface of the piezoelectric substrate. The supporting member is disposed on the adhesiveness improving film. Since the supporting member is disposed on the adhesiveness improving film, the supporting member can be firmly adhered to the piezoelectric substrate with the adhesiveness improving film interposed therebetween, and as a result, the reliability of the surface acoustic wave device can be increased. For example, an inorganic nitride or an inorganic oxide may preferably be used for such an adhesiveness improving film, and thereby the adhesiveness to the piezoelectric substrate can be effectively increased.

Preferably, the cover member in the surface acoustic wave device according to a preferred embodiment of the present invention is composed of epoxy resin. In this case, the cover member can be cured at a relatively low temperature of, for example, about 170° C. to 220° C. Accordingly, the supporting member can be formed using a low-temperature curing process.

Preferably, the surface acoustic wave device according to a preferred embodiment of the present invention further includes a protective layer composed of synthetic resin stacked on a side of the cover member opposite to the supporting member. Since the protective layer does not allow flux to pass therethrough, flux can be prevented from flowing into the hollow space during mounting of the surface acoustic wave device.

Preferably, the protective layer is composed of the same material as the supporting member. With this, the variety of materials can be reduced, and at the same time, manufacturing processes can be simplified.

The surface acoustic wave device according to a preferred embodiment of the present invention includes the supporting member so as to enclose the three-dimensional wiring portion in which the first and second wiring lines intersect with each other with the insulating layer interposed therebetween. As a result, the three-dimensional wiring portion faces the space enclosed by the piezoelectric substrate, the supporting member, and the cover member. Since the supporting member is not in contact with both the first and second wiring lines at the three-dimensional wiring portion, the first and second wiring lines are less susceptible to stress caused by a difference in the coefficients of linear expansion between the supporting member and the insulating layer. As a result, ruptures do not easily occur in the first and second wiring lines at the three-dimensional wiring portion.

Therefore, ruptures in the first and second wiring lines can be reliably prevented even when, for example, the supporting member and the cover member are formed of synthetic resin layers so as to reduce the thickness of the device and, at the same time, even when the insulating layer at the three-dimensional wiring portion is composed of a material that differs from that of the supporting member in view of reducing the parasitic capacitance.

Accordingly, ruptures at the three-dimensional wiring portions of the surface acoustic wave device can be reliably prevented in accordance with various preferred embodiments of the present invention so as to increase the reliability of the surface acoustic wave device.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will now be made clear by descriptions of specific preferred embodiments with reference to the drawings.

Figure 1:
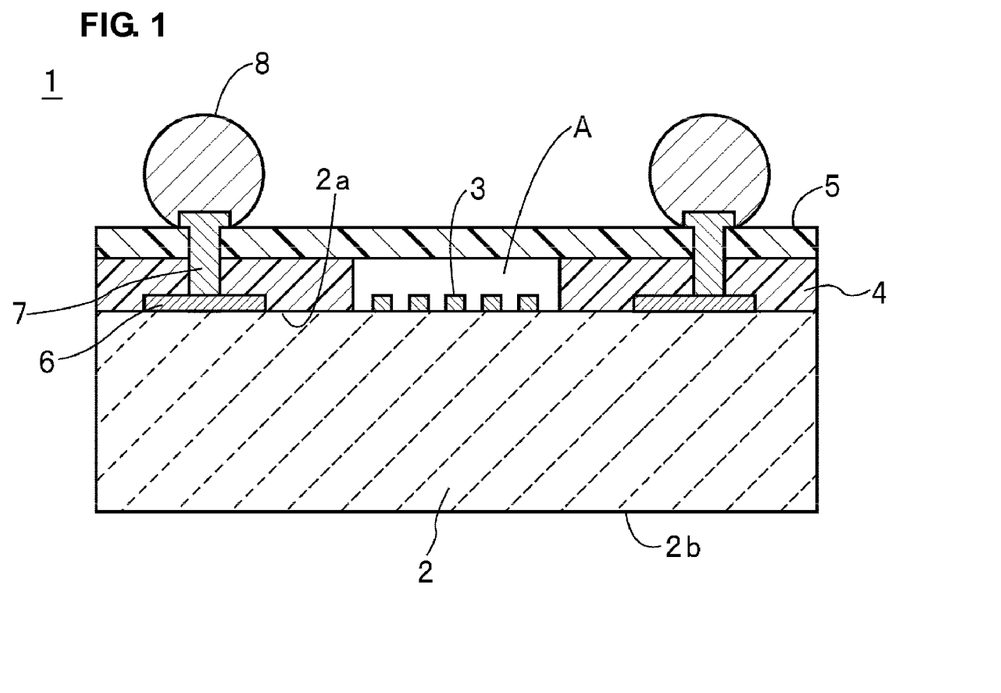
FIG. 1 is a schematic cross-section, viewed from the front, of a surface acoustic wave device according to a preferred embodiment of the present invention.
Figure 2:
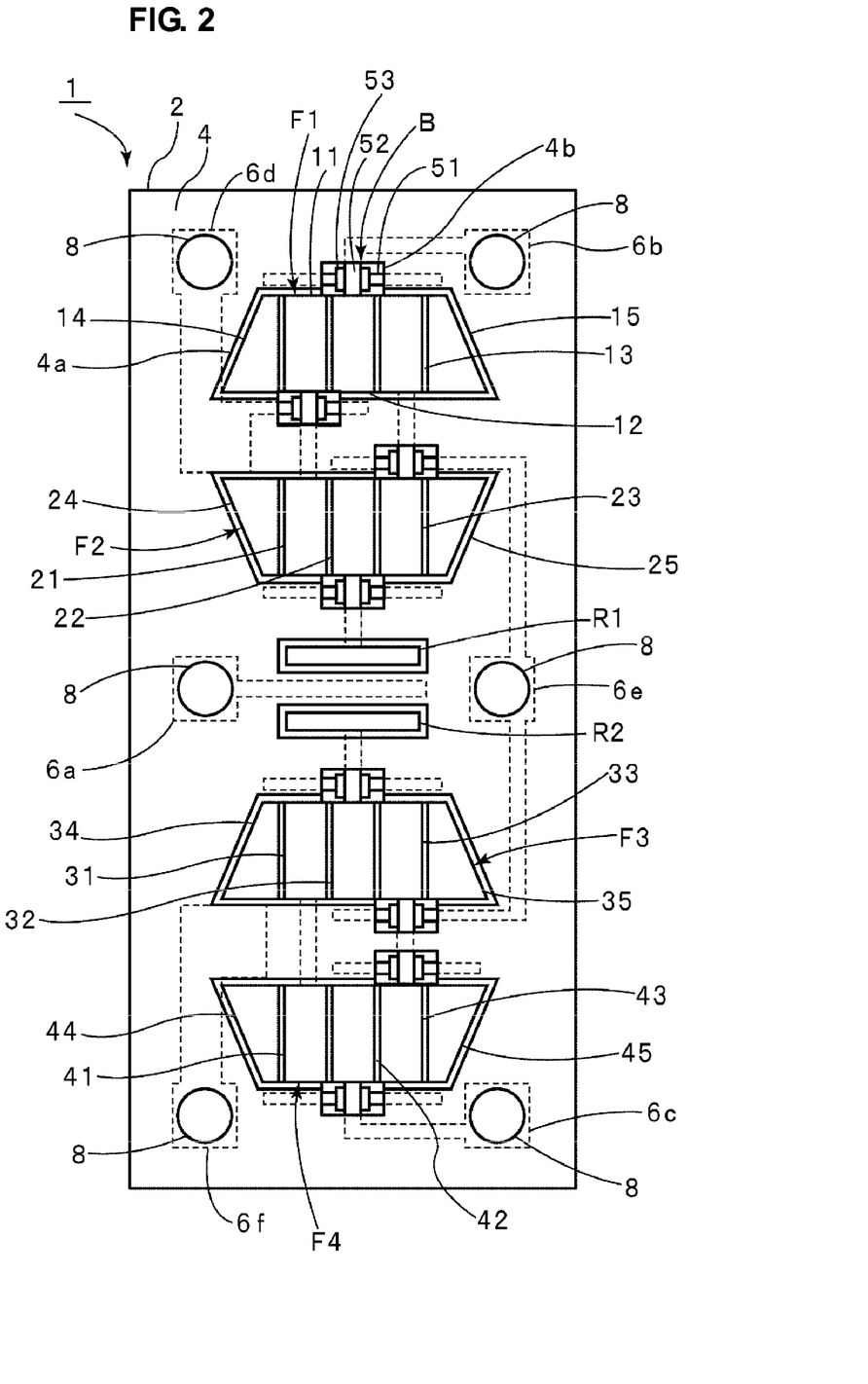
FIG. 2 is a schematic plan view illustrating a state where a cover member of the surface acoustic wave device according to the preferred embodiment shown in FIG. 1 is removed.

FIG. 1 is a schematic cross-section viewed from the front illustrating a surface acoustic wave device according to a preferred embodiment of the present invention, and FIG. 2 is a schematic plan view illustrating a state where a cover of the surface acoustic wave device is removed.

As shown in FIG. 1, a surface acoustic wave device 1 according to the present preferred embodiment includes a piezoelectric substrate 2. The piezoelectric substrate 2 is preferably composed of piezoelectric monocrystals such as $LiTaO_3$, $LiNbO_3$, or quartz crystal or piezoelectric ceramics. The piezoelectric substrate 2 includes an upper surface 2a serving as a first main surface and a lower surface 2b serving as a second main surface. Electrodes 3 including at least one IDT electrode are arranged on the upper surface 2a so as to excite surface acoustic waves. Spaces A are provided so as not to prevent sub-vibrating portions including the electrodes 3 from vibrating as in the surface acoustic wave device 101. That is, vibrating portions are arranged so as to face the respective spaces A.

A supporting member 4 and a cover member 5 are stacked on the upper surface 2a of the piezoelectric substrate 2 so as to seal the spaces A. More specifically, the supporting member 4 encloses the vibrating portions so as to define the spaces A. The cover member 5 is stacked on the supporting member 4 so as to seal the spaces A.

Through-holes extend through the supporting member 4 and the cover member 5 also in this preferred embodiment as in the known surface acoustic wave device 101. These through-holes reach electrode pads 6 located on the piezoelectric substrate 2. Via conductors 7 serving as under-bump metals are formed inside the through-holes. Lower ends of the via conductors 7 are joined to the electrode pads 6. The electrode pads 6 are electrically connected to the electrodes 3 by wiring lines (not shown).

Upper ends of the via conductors 7 are exposed at an upper surface of the cover member 5. Metal bumps 8 composed of solder are arranged so as to be electrically connected to the via conductors 7. The metal bumps 8 are used as terminal electrodes when the surface acoustic wave device 1 is mounted on, for example, a printed circuit board.

The electrodes 3 and the electrode pads 6, for example, are preferably composed of appropriate metals such as Ag, Al, Cu, and Pd or alloys. Moreover, these electrodes can be formed of metallic films formed by stacking a plurality of metallic layers. The wiring lines (described below) are also preferably composed of similar metallic materials, for example.

On the other hand, the supporting member 4 is preferably composed of a synthetic resin. Preferably, the supporting member 4 is composed of a photosensitive resin. Photosensitive resin can be easily patterned by photolithography. With this technique, openings for the spaces A and the through-holes to be formed at portions where the via conductors 7 are to be placed can be easily formed.

The above-described photosensitive resin includes, for example, photosensitive polyimide, photosensitive epoxy, and photosensitive silicone. Preferably, the supporting member 4 is composed of photosensitive polyimide. This can facilitate easy patterning of the supporting member 4 with high accuracy. Moreover, a load exerted on the piezoelectric substrate 2 and the cover member 5 can be reduced due to the moderate elasticity.

The cover member 5 is preferably composed of a synthetic resin. The synthetic resin of the cover member 5 is not specifically limited, and can be, for example, epoxy resin or polyimide. When epoxy resin is used, the resin can be cured at, for example, about 170° C. to about 220° C. This preferably allows formation of the cover member 5 using a low-temperature curing process.

Since the supporting member 4 and the cover member 5 are preferably formed of the synthetic resin layers in the surface acoustic wave device 1, the size, in particular, the thickness of the surface acoustic wave device can be reduced compared with the case where, for example, packaging members composed of, for example, metals or ceramics are used.

One of the unique features of the surface acoustic wave device 1 according to this preferred embodiment is that three-dimensional wiring portions described below are disposed inside spaces enclosed by the piezoelectric substrate 2, the supporting member 4, and the cover member 5. This will be described in detail with reference to FIG. 2.

FIG. 2 is a schematic plan view illustrating a state before the cover member 5 is formed in the surface acoustic wave device 1 according to this preferred embodiment. Although FIG. 2 illustrates the state before the cover member 5 is formed, the positions at which the metal bumps 8 are to be formed are indicated by circles with the reference number 8 so that the positions at which the metal bumps 8 are formed can be distinctive.

A plurality of surface acoustic wave elements F1 to F4, R1, and R2 are disposed on the piezoelectric substrate 2 in this preferred embodiment. The surface acoustic wave elements F1 to F4 preferably are three-IDT surface acoustic wave filters of the longitudinally coupled resonator type, and the surface acoustic wave elements R1 and R2 preferably are one-port surface acoustic wave resonators.

For example, the surface acoustic wave element F1 includes a first IDT electrode 11 to a third IDT electrode 13 disposed in a direction along which surface acoustic waves propagate and reflectors 14 and 15 disposed at either side of the portion at which the IDT electrodes 11 to 13 are formed in the direction along which surface acoustic waves propagate. In order to simplify the illustration, the IDT electrodes 11 to 13 are schematically illustrated by rectangular blocks, and the reflectors 14 and 15 are schematically illustrated by rectangular or trapezoidal blocks in FIG. 2.

Similarly, IDT electrodes and reflectors in the other surface acoustic wave elements F2 to F4 are schematically illustrated by rectangular blocks and trapezoidal blocks, respectively. That is, the surface acoustic wave element F2 includes a first IDT 21 to a third IDT 23 and reflectors 24 and 25, the surface acoustic wave element F3 includes a first IDT 31 to a third IDT 33 and reflectors 34 and 35, and the surface acoustic wave element F4 includes a first IDT 41 to a third IDT 43 and reflectors 44 and 45. Moreover, the surface acoustic wave elements R1 and R2 serving as the surface acoustic wave resonators each include an IDT electrode and reflectors (not shown) disposed at either side thereof in a direction along which surface acoustic waves propagate. Herein, the IDT electrode portions are schematically illustrated by rectangular blocks.

The electrodes 3 shown in FIG. 1 schematically illustrate an electrode structure of one of the surface acoustic wave elements. For example, in the case of the surface acoustic wave element F1, the portion at which the IDT electrodes 11 to 13 and the reflectors 14 and 15 are located corresponds to the portion at which the electrodes 3 are located in FIG. 1, that is, corresponds to the vibrating portion.

The supporting member 4 of the surface acoustic wave device 1 includes openings 4a for the spaces A that enclose the respective vibrating portions. For example, an opening 4a is provided at the portion where the surface acoustic wave element F1 is located so as to enclose the vibrating portion including the IDT electrodes 11 to 13 and reflectors 14 and 15. Subsequently, the cover member 5 shown in FIG. 1 is stacked on the supporting member so as to seal the openings 4a.

The surface acoustic wave elements F1 to F4 and the surface acoustic wave elements R1 and R2 are connected to each other so as to define a band-pass filter. In this case, the wiring lines on the piezoelectric substrate 2 include three-dimensional wiring portions so as to reduce the size of the device and to increase the packaging density.

In FIG. 2, an electrode pad 6a serving as an unbalanced input terminal, electrode pads 6b and 6c serving as first and second balanced output terminals, respectively, and electrode pads 6d to 6f connected to a ground potential are arranged as the electrode pads 6 schematically shown in FIG. 1.

The surface acoustic wave elements F2 and F1 serving as the three-IDT surface acoustic wave filters of the longitudinally coupled resonator type are connected to the electrode pad 6a serving as the input terminal in this order with the surface acoustic wave element R1 serving as the surface acoustic wave resonator interposed therebetween. Similarly, the surface acoustic wave elements F3 and F4 serving as the three-IDT surface acoustic wave filters of the longitudinally coupled resonator type are connected to the electrode pad 6a in this order with the surface acoustic wave element R2 serving as the one-port surface acoustic wave resonator interposed therebetween. This defines a band-pass filter having a balanced-to-unbalanced conversion function.

In this structure, the wiring patterns on the piezoelectric substrate 2 become complicated. To avoid this, three-dimensional wiring portions in which a plurality of wiring lines intersect with each other in a three-dimensional manner are provided. In a three-dimensional wiring portion B indicated by an arrow in FIG. 2, for example, a first wiring line 51 and a second wiring line 52 intersect with each other in a three-dimensional manner. The first wiring line 51 electrically connects an end of the IDT electrode 11 to an end of the IDT electrode 13, and the second wiring line 52 electrically connects the electrode pad 6b serving as an output terminal to the IDT electrode 12. The first wiring line 51 and the second wiring line 52 need to be electrically insulated from each other. To this end, the first wiring line 51 is disposed on the piezoelectric substrate, an insulating layer 53 is disposed on the first wiring line 51, and the second wiring line 52 is disposed on the insulating layer 53.

The insulating layer 53 is designed to electrically insulate the first wiring line 51 and the second wiring line 52 from each other in the three-dimensional wiring portion B. In addition, a synthetic resin used for the insulating layer 53 is selected such that the parasitic capacitance between the first wiring line 51 and the second wiring line 52 is reduced. Therefore, the synthetic resin used for the insulating layer 53 differs from that used for the supporting member 4, which is simply a part of the package.

Accordingly, the coefficient of linear expansion of the supporting member 4 and that of the insulating layer 53 differ from each other. However, the supporting member 4 is not disposed over the second wiring line 52 at the three-dimensional wiring portion in this preferred embodiment. That is, the supporting member 4 also includes an opening 4b that encloses the three-dimensional wiring portion in addition to the openings 4a that enclose the vibrating portions. In other words, the three-dimensional wiring portion B is disposed in a hollow space enclosed by the piezoelectric substrate 2, the supporting member 4, and the cover member. Therefore, stress caused by a difference in the coefficients of linear expansion is not applied to the three-dimensional wiring portion since the supporting member 4 is not disposed over the second wiring line 52. As a result, the second wiring line 52 does not easily rupture in the surface acoustic wave device 1 even when the ambient temperature changes.

This will be described in more detail with reference to a comparative example shown in FIG. 3.

Figure 3:
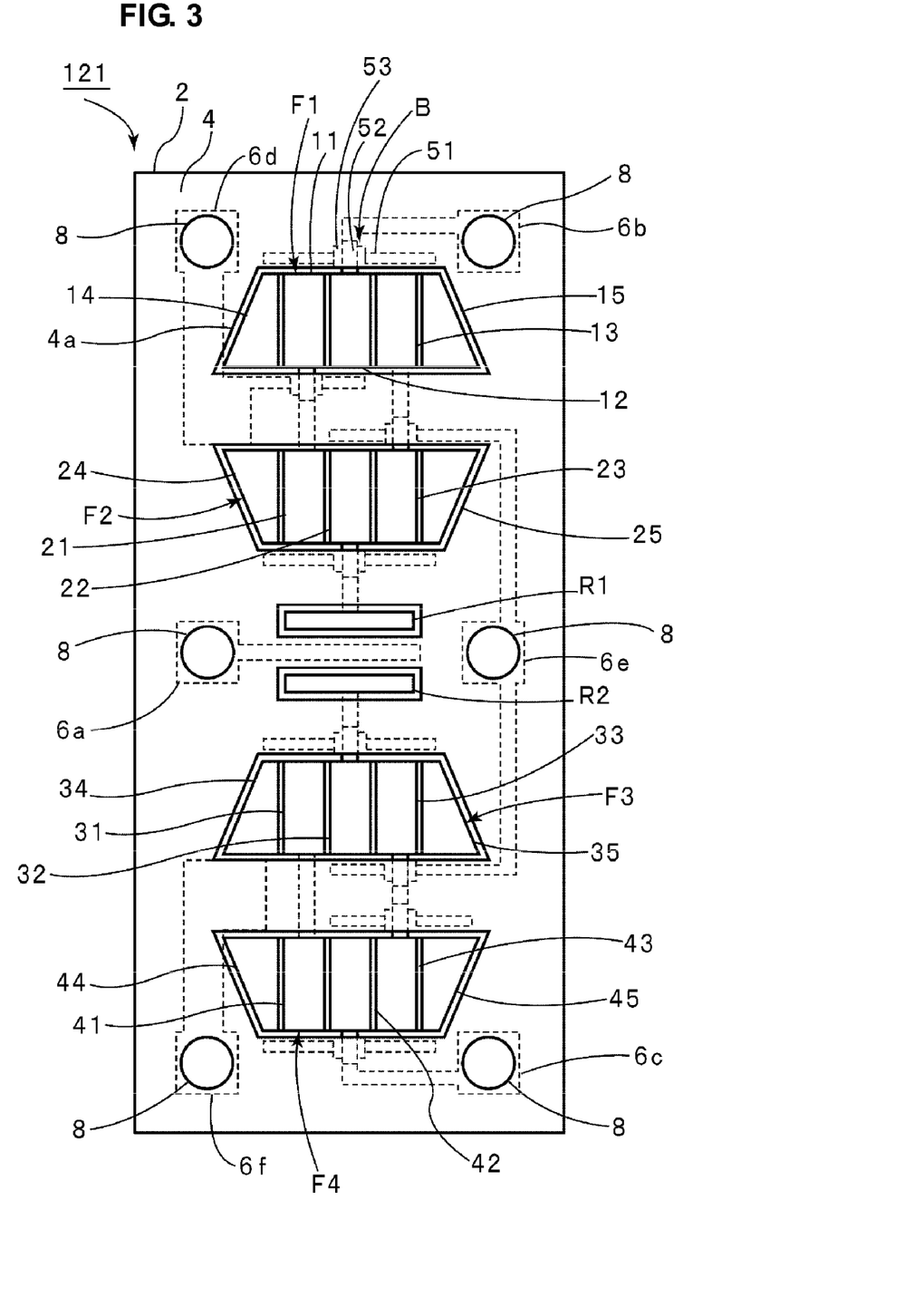
FIG. 3 is a schematic plan view of a surface acoustic wave device serving as a comparative example.

A surface acoustic wave device 121 of the comparative example shown in FIG. 3 has the same structure as the surface acoustic wave device 1 according to the above-described preferred embodiment except that the three-dimensional wiring portion is covered with the supporting member 4. External shapes of the wiring patterns and the insulating layer at the three-dimensional wiring portion are indicated by broken lines. When the supporting member 4 also covers the second wiring line 52 at the three-dimensional wiring portion as described above, stress caused by a difference in the coefficients of linear expansion between the supporting member 4 and the insulating layer 53 is applied to the second wiring line 52 as in the above-described known technology. This easily causes ruptures in the second wiring line 52.

Figure 4:
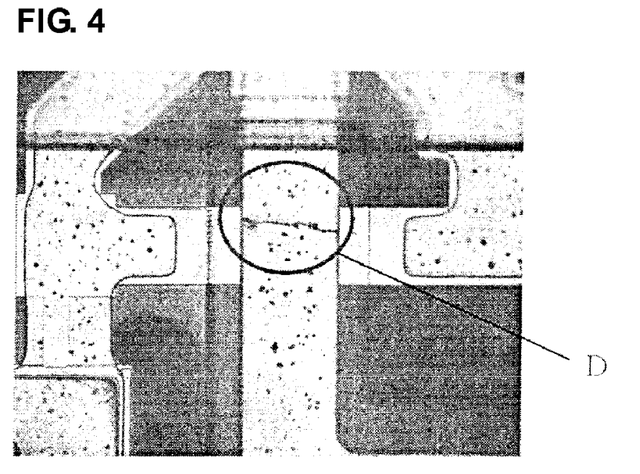
FIG. 4 is a photograph illustrating a rupture occurring at a wiring line in the surface acoustic wave device of the comparative example.

FIG. 4 is a photograph schematically illustrating a rupture D occurring in the second wiring line 52 at the three-dimensional wiring portion of the above-described comparative example.

In contrast, ruptures due to stress caused by a difference in the coefficients of linear expansion do not easily occur in the above-described preferred embodiment since the supporting member 4 does not exist over the second wiring line 52 as described above.

The three-dimensional wiring portion B in FIG. 2 was described as a typical example, and the supporting member 4 also includes openings that enclose other three-dimensional wiring portions at positions of the other three-dimensional wiring portions shown in FIG. 2, that is, portions including a plurality of wiring lines stacked with the insulating layers 53 interposed therebetween such that the supporting member 4 is not located over the upper wiring lines.

Accordingly, ruptures in the three-dimensional wiring portions can be reliably prevented in the surface acoustic wave device 1 even when the device has a layered structure including the supporting member 4 and the cover member 5 composed of a synthetic resin so as to reduce the thickness of the device and, furthermore, wiring patterns including a plurality of wiring lines that intersect with each other in a three-dimensional manner so as to reduce the size of the device, or even when the insulating layers of the three-dimensional wiring portions are composed of an appropriate synthetic resin so that the parasitic capacitances between the wiring lines are reduced.

As a result, the reliability of the surface acoustic wave device can be increased and at the same time, the size of the surface acoustic wave device can be reduced.

Moreover, the three-dimensional wiring portions can reduce capacitances of the wiring lines to the ground, and thereby can improve attenuation characteristics of the device.

Figure 5:
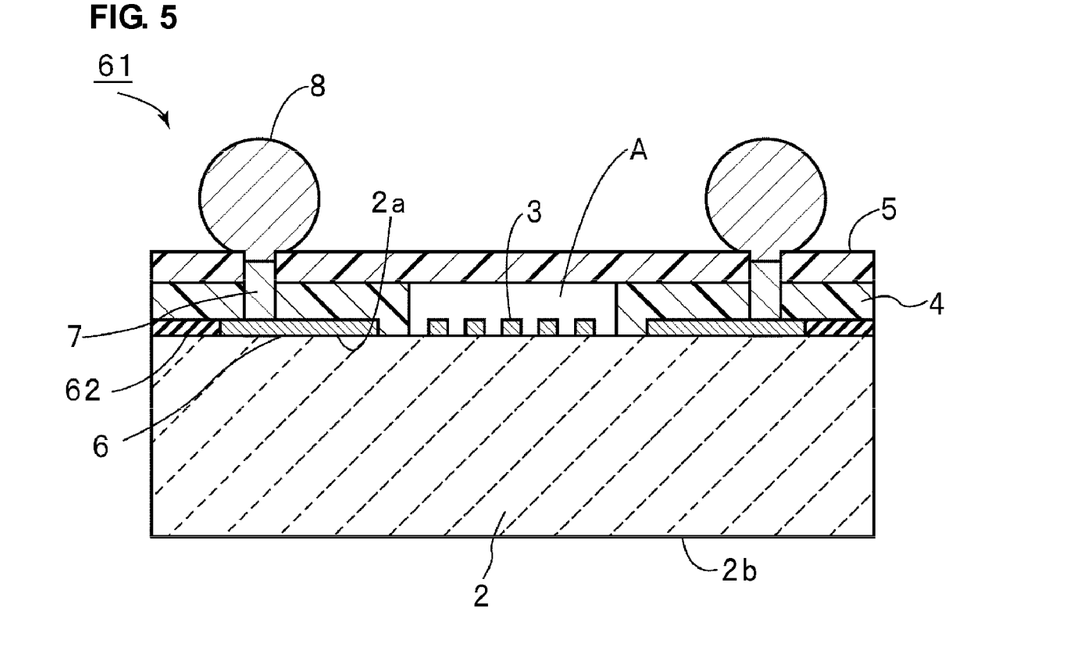
FIG. 5 is a schematic front view illustrating a surface acoustic wave device according to a modification of the preferred embodiment shown in FIG. 1.

FIG. 5 is a schematic cross-section viewed from the front illustrating a modification of the surface acoustic wave device 1 according to the above-described preferred embodiment.

A surface acoustic wave device 61 of this modification includes an adhesiveness improving film 62 located on the piezoelectric substrate 2. The adhesiveness improving film 62 is composed of an appropriate material having a high adhesiveness to the piezoelectric substrate compared with the supporting member 4. The material includes, for example, an inorganic nitride or an inorganic oxide. More specifically, the nitride includes SixNy (where x and y are integers), AlN, and the like, and the inorganic oxide includes $SiO_2$, $AlO_3$, and the like. The adhesiveness improving film 62 composed of such an inorganic nitride or inorganic oxide has a relatively high adhesiveness compared with the synthetic resin used for the supporting member 4 when the film is formed on the piezoelectric substrate 2 by sputtering. Therefore, the supporting member 4 can be firmly adhered to the piezoelectric substrate 2 with the adhesiveness improving film 62 interposed therebetween by forming the supporting member 4 after the formation of the adhesiveness improving film 62. With this, the reliability of the surface acoustic wave device 61 can be further increased.

The adhesiveness improving film 62 is at least partially disposed on the lower surface of the supporting member 4. Preferably, the adhesiveness improving film 62 is disposed on the lower surface of the supporting member 4 in areas other than portions at which electrodes such as the electrode pads 6 are located. With this unique structure, the supporting member 4 can be firmly adhered to the piezoelectric substrate 2 with the adhesiveness improving film 62 interposed therebetween in the areas other than the portions at which the electrode pads 6 and the like are located. However, the adhesiveness improving film 62 can be disposed on the lower surface of the supporting member 4 in only portions of the areas other than the areas in which the electrode pads 6 and the like exist.

Figure 6:
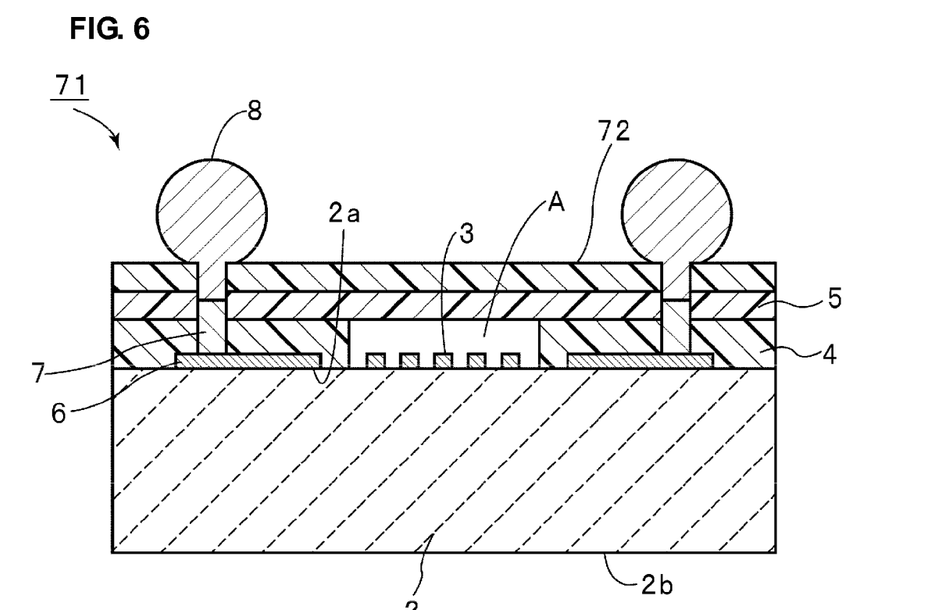
FIG. 6 is a schematic front view of a surface acoustic wave device according to another modification of the preferred embodiment shown in FIG. 1.

FIG. 6 is a cross-section viewed from the front illustrating another modification of the surface acoustic wave device 1 according to the above-described preferred embodiment. A surface acoustic wave device 71 of the modification shown in FIG. 6 includes a protective film 72 disposed on the cover member 5. Other aspects are the same as those of the first preferred embodiment.

The protective film 72 is stacked on a side of the cover member 5 remote from the supporting member 4. The protective film 72 can prevent flux from entering, for example, the spaces A during mounting of the device using solder. That is, flux can be prevented from entering inside the device by forming the protective film 72 using a material through which flux cannot pass as described above. The material includes various synthetic resins, and can be, for example, polyimide.

Preferably, the protective film 72 is composed of the same material as the supporting member 4. In this case, the variety of materials in use can be reduced. Moreover, manufacturing processes can also be simplified.

The protective film 72 is desirably arranged on the entire upper surface of the cover member 5 except for the portions at which the via conductors are located since the protective film is arranged so as to prevent flux from entering as described above.

Although the insulating layers in the three-dimensional wiring portions are preferably composed of a synthetic resin in the above-described preferred embodiment, the insulating layers can be composed of an insulating material other than the synthetic resin. In either case, the supporting member 4 and the insulating layers in the three-dimensional wiring portions can be composed of materials other than synthetic resin as long as the material of the insulating layers in the three-dimensional wiring portions differs from that of the supporting member.

Although the surface acoustic wave filters of the longitudinally coupled resonator type and the one-port surface acoustic wave resonators are preferably connected to each other in the surface acoustic wave device 1 according to the above-described preferred embodiment, a plurality of other surface acoustic wave elements can be connected to each other. That is, the circuit configuration in the surface acoustic wave device of the present invention is not particularly limited, and the present invention can be widely incorporated into various surface acoustic wave devices including a plurality of surface acoustic wave elements electrically connected to each other.

Moreover, each of the three-dimensional wiring portions only needs to have the first and second wiring lines stacked with the corresponding insulating layer interposed therebetween, and can have one or more additional wiring lines stacked with one or more additional insulating layers interposed therebetween. That is, the number of stacked wiring line layers in each of the three-dimensional wiring portions is not limited to two, and can be three or more.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A surface acoustic wave device comprising:
    a piezoelectric substrate including a first main surface and a second main surface that face each other;
    an electrode arranged on the first main surface of the piezoelectric substrate so as to excite surface acoustic waves and to define a vibrating portion;
    a plurality of electrode pads arranged on the first main surface of the piezoelectric substrate and electrically connected to the electrode of the vibrating portion with a plurality of wiring lines disposed therebetween;
    a three-dimensional wiring portion at which two wiring lines of the plurality of wiring lines intersect each other with an insulating layer interposed therebetween;
    a supporting member arranged on the first main surface of the piezoelectric substrate, having a thickness greater than a thickness of the electrode of the vibrating portion, and including a first opening that encloses the vibrating portion; and
    a cover member arranged on the supporting member so as to seal the first opening; wherein
    the supporting member and the insulating layer are made of different materials;
    the supporting member further includes a second opening that encloses the three-dimensional wiring portion; and
    the second opening is sealed by the cover member.

2. The surface acoustic wave device according to claim 1, further comprising:
    an adhesiveness improving film having an adhesiveness to the piezoelectric substrate that is higher than an adhesiveness of the supporting member to the piezoelectric substrate and is located on the first main surface of the piezoelectric substrate, wherein
    the supporting member is at least partially located on the adhesiveness improving film.

3. The surface acoustic wave device according to claim 2, wherein the adhesiveness improving film is composed of an inorganic nitride or an inorganic oxide.

4. The surface acoustic wave device according to claim 1, wherein the cover member is composed of epoxy resin.

5. The surface acoustic wave device according to claim 1, further comprising a protective layer composed of synthetic resin stacked on a side of the cover member remote from the supporting member.

6. The surface acoustic wave device according to claim 5, wherein the protective layer is composed of the same material as the supporting member.

* * * * *